(12) United States Patent
Aherne

(10) Patent No.: US 9,621,156 B2
(45) Date of Patent: Apr. 11, 2017

(54) ANALOG SWITCHES AND METHODS FOR CONTROLLING ANALOG SWITCHES

(71) Applicant: Analog Devices Global, Hamilton (BM)

(72) Inventor: David Aherne, Raheen (IE)

(73) Assignee: Analog Devices Global, Hamilton (BM)

( * ) Notice: Subject to any disclaimer, the term of this patent is extended or adjusted under 35 U.S.C. 154(b) by 161 days.

(21) Appl. No.: 14/109,249

(22) Filed: Dec. 17, 2013

(65) Prior Publication Data

US 2015/0171861 A1 Jun. 18, 2015

(51) Int. Cl.
*H03K 17/00* (2006.01)
*H03K 17/687* (2006.01)

(52) U.S. Cl.
CPC . *H03K 17/6872* (2013.01); *H03K 2217/0018* (2013.01)

(58) Field of Classification Search
CPC ......... H01L 2924/00; H01L 2924/0002; H01L 27/14603; H01L 27/14609
See application file for complete search history.

(56) References Cited

U.S. PATENT DOCUMENTS

| 6,163,199 A * | 12/2000 | Miske et al. ................... 327/434 |
| 8,847,665 B2 * | 9/2014 | Araki ............... H03K 17/08122 327/391 |
| 2009/0058496 A1 * | 3/2009 | Kapoor ................... G05F 3/242 327/391 |

FOREIGN PATENT DOCUMENTS

| CN | 104716939 A | 6/2015 |
| EP | 0 729 232 B1 | 9/2003 |

OTHER PUBLICATIONS

"German Application Serial No. 102014118167.0, Office Action mailed Sep. 30, 2016", 6 pgs.
Analog Devices, "Power-Off Protection ±5V, +12V, Quad SPST Switches with 5Ω on Resistance," ADG4612/ADG4613 Datasheet, Rev. 0, Oct. 2010, pp. 1-24.
Maxim Integrated, "Above- and Below-the-Rails Low On-Resistance Analog Switches," MAX14759/MAX14761/MAX14763 Datasheet, Rev. 1, Aug. 2012, pp. 1-16.

* cited by examiner

*Primary Examiner* — Sibin Chen
(74) *Attorney, Agent, or Firm* — Schwegman, Lundberg, & Woessner, P.A.

(57) ABSTRACT

An analog switch may be maintained reliably in an off state. The switch comprises: a P-type first transistor having a source, a drain and a gate, a N-type second transistor having a source, a drain and a gate, and a switch control circuit to drive the gates of the first and second transistors. The drain of the first transistor and the source of the second transistor are connected at a first node, and the source of the first transistor and the drain of the second transistor are connected at a second node. When the voltage at the first or second nodes falls outside of a supply voltage range of the switch control circuit, the switch control circuit is operable, in response to a signal to make the switch high impedance, by adjusting the gate voltages of the first transistor and the second transistor.

20 Claims, 6 Drawing Sheets

ANALOG SWITCHES AND METHODS FOR CONTROLLING ANALOG SWITCHES

FIELD

This invention relates to analog switches and an apparatus and a method for controlling analog switches.

BACKGROUND

Analog switches, such as transmission gates or transfer gates built using transistors, can be used to selectively pass or block analog signals. An ideal semiconductor based analog switch operates like a mechanical switch, for example like a light switch. In an 'on' state, the analog switch should pass a signal between its nodes like a short circuit. In an 'off' state the switch should act as an open circuit.

A problem associated with semiconductor based analog switches is that they can fail to operate like a mechanical switch. For example, the semiconductor based analog switch can sometimes end up partially on even when it should be 'off' or the analog switch can be slow to switch between 'off' and 'on'. In order for the semiconductor based switches to operate more like mechanical switches often they need to operate with specified parameters. For example, the signal the analog switch is switching can be limited by the voltage range applied to the gate terminals of the transistors forming the switches. The gate terminal can be used to switch the transistor off and on, in this way it operates like a faucet valve controlling the flow of current between the source and drain terminals of the transistor. The voltage range that can be applied to the gate is usually limited to the voltage supply to available in the circuit, which is sometimes called a supply rail. When an input signal falls outside of the device's supply rails, i.e. exceeds the most positive supply voltage or falls below the most negative supply voltage, many analog switches exhibit non-ideal behavior, significant including leakage in the "off" state and decreased switching speed and linearity. This is undesirable.

SUMMARY

According to a first aspect of this disclosure, there is provided an analog switch that adjusts voltages on its switching transistors to meet a desired switching state, comprising:
  a P-type first transistor having a source, a drain and a gate;
  a N-type second transistor having a source, a drain and a gate where the source of the second transistor is coupled to the drain of the first transistor at a first node and the drain of the second transistor is coupled to the source of the first transistor at a second node; and
  a switch control circuit configured to drive at least one of the gates of the first and second transistors with a voltage derived from at least one of a voltage at the first node and a voltage at the second node when at least one voltage at the first and second nodes falls outside of a supply voltage range of the switch control circuit.

The first and second transistors act as switching transistors of the analog switch.

The switch control circuit may be operable, when seeking to place the analog switch in a high impedance state, to drive the gate of the first transistor with a voltage derived from the most positive voltage of the voltage at the first node and the voltage at the second node and to drive the gate of the second transistor with a voltage derived from the most negative voltage of the voltage at the first node and the voltage at the second node when the voltage at the first or second nodes falls outside of a supply voltage range of the switch control circuit.

In an embodiment there is provided an analog switch, comprising a P-type first transistor having a source, a drain and a gate; a N-type second transistor having a source, a drain and a gate, and a switch control circuit operable to drive the gates of the first and second transistors, wherein the drain of the first transistor and the source of the second transistor are connected at a first node, and the source of the first transistor and the drain of the second transistor are connected at a second node, and wherein when the voltage at the first or second nodes falls outside of a supply voltage range of the switch control circuit, in response to a signal to make the switch high impedance the switch control circuit is operable to drive the gate of the first transistor with a voltage derived from the most positive voltage of the voltage at the first node and the voltage at the second node and to drive the gate of the second transistor with a voltage derived from the most negative voltage of the voltage at the first node and the voltage at the second node.

When the voltage at both the first and second nodes is within the supply voltage range of the switch control circuit then the switch control circuit may be arranged to supply its positive supply rail voltage to the first transistor. Thus the switch control circuit may include a first portion arranged to supply the most positive of the voltage at the source of the P-type transistor, the voltage at the drain of the P-type transistor and the most positive of one of the switch control circuit supply voltages to the gate of the transistor to hold the transistor in a non-conducting state.

When the voltage at both the first and second nodes is within the supply voltage range the switch control circuit may be arranged to supply its negative supply rail voltage to the second transistor. Thus the switch control circuit may include a second portion arranged to supply the most negative one of the voltage at the source of the N-type transistor, the voltage at the drain of the N-type transistor and the most negative of the switch control circuit supply rails to the gate of the N-type transistor to hold it in a non-conducting state.

By dynamically controlling the voltage at the gates of the first and second transistors based on the voltages at the first and second nodes of the switch, the voltage at the first and second nodes is prevented from extending outside of the gate voltage range (being a voltage range over which the switch control circuit or switch controller can drive the gates) and as such the gates of the first and second transistors are always biased sufficiently to maintain correct operation of the switch. The switch may be operated bidirectionally, i.e. having a signal passing from the first node to the second node or from the second node to the first node since the control circuitry is operable to determine the most positive of the first and second node voltages.

Preferably, the first transistor further comprises a first back gate. Preferably the second transistor also has a back gate, which will be identified as a second back gate. The control circuitry may be operable to drive the first back gate with the most positive voltage of the first node voltage and the second node voltage and to drive the second back gate with the most negative voltage of the first node voltage and the second node voltage.

Advantageously, the control circuitry may comprise a switch bias circuit operable to compare the first node voltage with the second node voltage and output the most positive of the first and second node voltages to a first positive node and output the most negative of the first and second voltages to a first negative node.

Preferably, the switch control circuit may further comprise a most-positive selection circuit operable to compare the voltage at the first positive node with the most positive supply voltage to the switch controller and to output the most positive of voltage at the first positive node and the most positive supply voltage to a most positive circuit output node. The switch control circuit may further comprise a most-negative selection circuit operable to compare the voltage at the first negative node with the most negative supply voltage to the switch control circuit and output the most negative of voltage at the first negative node and the most negative supply voltage to a most negative circuit output node.

Advantageously, the control circuitry may further comprise a level shifter operable, in response to the signal to open the switch (that is to make the switch non-conducting), to drive the first gate with the voltage of the most positive circuit output node and to drive the second gate with the voltage of the most negative circuit output node.

The transistors of the switch and the control circuit for the switch may be fabricated on a single integrated circuit or multiple integrated circuits or may be implemented using discrete components.

As is known to the person skilled in the art, a Field effect transistor (or at least an enhancement mode device) is non conducting when its gate is at or close to the voltage at the source of the transistor. The transistor becomes progressively more conducting as the difference between the gate and source voltages increase. Conduction starts to become significant at a "threshold voltage". It will also be appreciated that the source and drain of a MOSFET are interchangeable since such devices are substantially symmetrical. Accordingly, in embodiments described herein the source and drain of any transistor may be swapped without affecting functionality of the circuits described.

When it is desired to turn the analog switch on, the switch controller may be arranged to drive the control nodes of the first and second transistors to a voltage outside of the range of the first threshold voltage.

Turning the first transistor on may be achieved by driving the gate of the first transistor to a most negative one of the switch control circuit supply voltages.

Turning the second transistor on may be achieved by driving the gate of the second transistor to a most positive one of the switch control circuit supply voltages.

Thus, in response to a control signal to permit signal transmission through the switch, the circuitry may be operable to drive the first gate with the most negative supply voltage and to drive the second gate with the most positive supply voltage.

It will be appreciated that in some embodiments a switch need not be bidirectional. This may be because the voltage at one of the first and second nodes is always greater than or equal to the voltage at the other node. In this scenario there is no need to determine the most positive of the first and second nodes. In which case, there may be provided a switch, comprising: a P-type transistor comprising a first drain, a first source and a first gate; an N-type transistor comprising a second drain, a second source and a second gate; the first drain and second source connected to a first node; the first source and second drain connected to a second node; and control circuitry, wherein in response to a signal to inhibit signal transmission the switch the control circuitry is operable to drive the first gate with the most positive voltage of a first node voltage at the first node and the most positive supply voltage of the switch, and drive the second gate with the most negative voltage of a second node voltage at the second node and the most negative supply voltage of the switch.

According to a further aspect of this disclosure there is provided a method of driving a transmission gate formed of a first transistor and a second transistor, where the first transistor is a P-type FET and the second transistor is an N-type FET, and wherein a drain of the first transistor and a source of the second transistor are connected to a first node, and a source of the first transistor and a drain of the second transistor are connected to a second node, and wherein in response to an instruction to place the switch in a high impendence state, the method comprises supplying the gate of the first transistor with the most positive voltage selected from 1) a supply voltage for a driver circuit for driving the first transistor, 2) a voltage at the first node, and 3) a voltage at the second node; and supplying a gate of the second transistor with the most negative (least positive) voltage selected from 1) a supply voltage for a driver circuit for driving the second transistor, 2) a voltage at the first node, and 3) a voltage at the second node.

The supply voltage may comprise two voltage rails, with one being more positive than the other, such as $V_{dd}$ and $V_{ss}$, $V_{dd}$ and ground, Ground and $V_{ss}$ and so on.

BRIEF DESCRIPTION OF THE DRAWINGS

Embodiments of analog switches in accordance with this disclosure will now be described, by non-limiting example only, with reference to the accompanying drawings, in which.

DESCRIPTION OF EXAMPLE EMBODIMENTS

Figure 1:
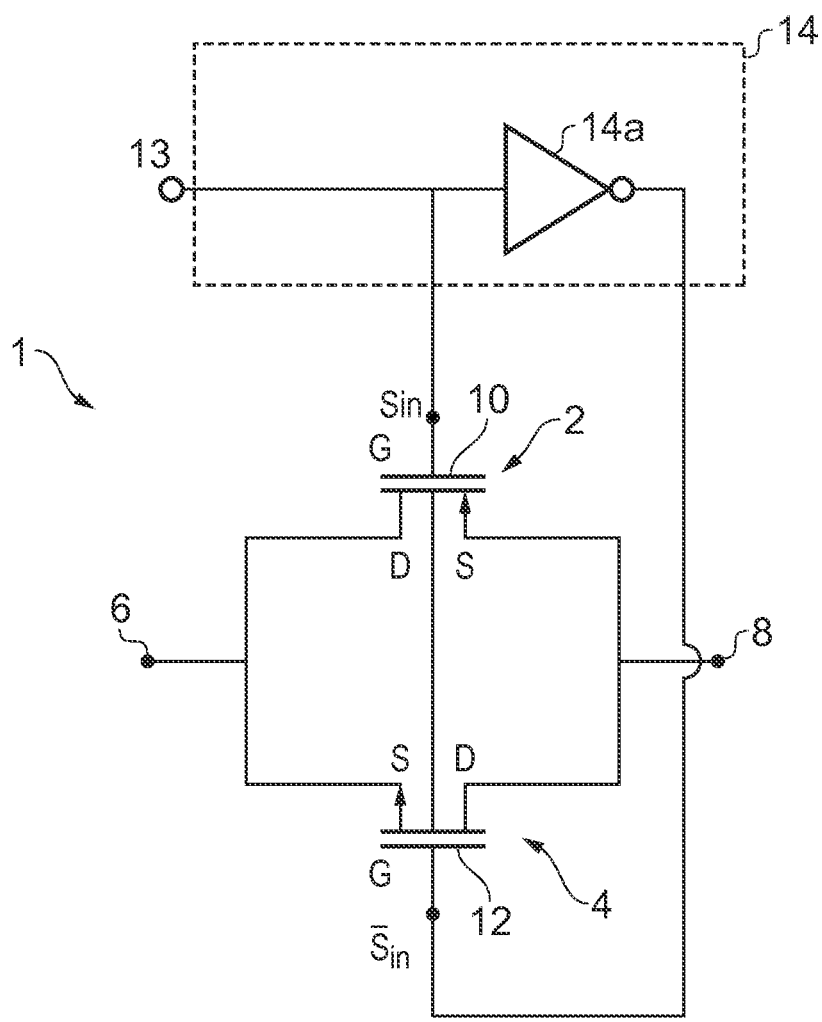
FIG. 1 is a schematic diagram of an analog switch.

FIG. 1 is a schematic illustration of a transmission gate 1 or analog switch as is known in the art. The transmission gate 1 comprises first and second field effect transistors 2 and 4. The first transistor 2 is a PMOS device and the second transistor 4 is an NMOS device. It will be appreciated that first and second transistors 2 and 4 could be replaced with other transistors having the same or similar characteristics. Each of the first and second transistors 2, 4 comprises a source, a drain and a gate as is known in the art. The drain of the first transistor 2 and the source of the second transistor 4 are coupled together at a first node 6 of the transmission gate 1. Equally, the source of the first transistor 2 and the drain of the second transistor 4 are coupled together at a second node 8. Because the transmission gate 1 is substantially symmetrical, this device 1 provides bidirectional connectivity without degradation of an input signal. As such, either of the first or second nodes 6 and 8 can function as an input or an output of the transmission gate 1. However in general one of the nodes 6 and 8 can be expected to function as an input and the other node as an output.

A switch drive circuit 14 (such as a switch controller) receives a control signal Sin to an input node 13 and processes this, for example by way of logic such as an inverter 14a such that the gate nodes 10, 12 of the first and second transistors 2 and 4 are driven in complimentary fashion by the switch drive/control circuitry 14 between two reference voltages, namely $V_{ref1}$ representing Logic 1 and $V_{ref2}$ representing Logic 0. Voltages $V_{ref1}$ and $V_{ref2}$ may be any two reference voltages such that $V_{ref1} > V_{ref2}$. Typically $V_{ref1}$ and $V_{ref2}$ are equal to the supply rail voltages of the circuit in which the transmission gate 1 is incorporated or are the supply voltages to the drive circuit 14 as this limits the output voltage range that the drive circuit can supply. For example, $V_{ref1}$ may be equal to $V_{dd}$ and $V_{ref2}$ may be equal to $V_{ss}$. A gate voltage range Gr may be defined as $V_{ref1} > Gr > V_{ref2}$. The gates 10, 12 are driven in a complimentary manner as indicated by Sin and Sin(bar) such that both transistors 2 and 4 are either simultaneously on or simultaneously off. In other words, when the voltage at gate 10 (active low) is Logic 0, the complementary Logic 1 is applied to gate 12 (active high) by the inverter 14a allowing both transistors to conduct and pass a signal between first and second nodes 6 and 8. In this configuration, the transmission gate 1 is on (conducting). When the voltage at gate 10 (active low) is Logic 1, the complementary Logic 0 is applied to gate 12 turning both transistors off. In this configuration, the transmission gate 1 is off (non-conducting) preventing a signal from passing between the first and second nodes 6 and 8.

The transmission gate 1 shown in FIG. 1 functions in the above manner while signals applied to the first and second nodes 6 and 8 fall within the gate voltage range Gr supplied to the gates 10 and 12. However, functionality of the transmission gate 1 breaks down when either of the first and second nodes 6 and 8 is supplied with a voltage falling outside of the gate voltage range.

Figure 2:
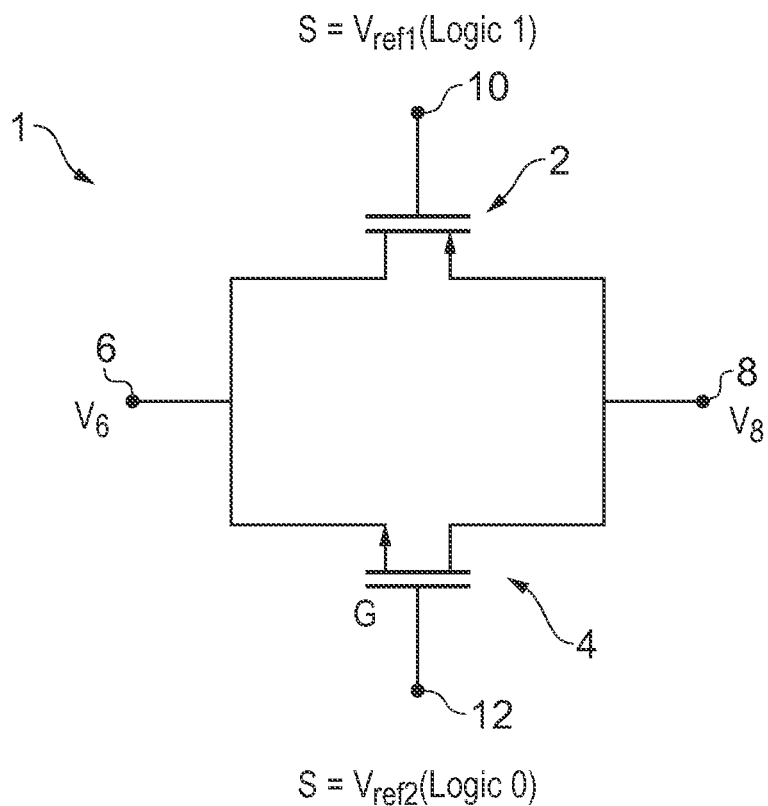
FIG. 2 is a schematic diagram of the analog switch shown in FIG. 1 showing condition states thereof.

FIG. 2 shows the transmission gate 1 signaled to switch off, in which the first gate 10 is driven at $V_{ref1}$ (Logic 1) and the second gate 12 is driven at $V_{ref2}$ (Logic 0). While the voltages at the first and second nodes 6 and 8 are within the gate voltage range, the transmission gate 1 functions in its high impedance state, preventing signals from passing between the nodes 6 and 8. However, the transistors can become inadvertently conducting when the voltage at either of the first or second nodes 6 and 8 lies outside of the gate voltage range. When the voltage at node 8 exceeds $V_{ref1}$ the first (PMOS) transistor 2 switches on. When the voltage at node 6 drops below $V_{ref2}$ the second (NMOS) transistor 4 switches on. As such, applying a voltage outside of the gate voltage range to either of the first and second nodes 6 and 8, can cause the transmission gate 1 to conduct in its supposedly non-conducting state. Thus, analog switches like that shown in FIGS. 1 and 2 are limited in signal range by the range of the applied gate voltage which is typically equal to the range of the device's supply voltage, or the supply voltage of the drive circuit 14 used to drive the gates. Although the drive circuit 14 is shown as comprising an inverter 14a, other logic elements are suitable for generating the complimentary control signals.

It will be appreciated that the above problems arise when the transmission gate 1 is meant to be driven in an off state. When the transmission gate 1 is switched on, the presence of a voltage at either of the first and second nodes 6 and 8 in excess of the reference voltages does not affect the state of the switch.

Embodiments of this disclosure provide an analog switch which can both pass and block signals that are outside the power supply range of the switch or the switch controller 14. In the embodiments described, reference voltages are denoted as supply rail voltages $V_{dd}$ and $V_{ss}$. It will be appreciated $V_{dd}$ and $V_{ss}$ could be any two differing voltages, for example $V_{dd}$=5V and $V_{ss}$=0V, or $V_{dd}$=+5V and $V_{ss}$=−5V. It will also be appreciated that statements that a first voltage is "greater than" a second voltage means that the first voltage is more positive than the second voltage. Similarly statements that a first voltage is "less than" a second voltage means that the first voltage is more negative than the second voltage. In the disclosure, first, second, third, etc., transistors of embodiments may not always be introduced by their full name (e.g. twelfth transistor M12) but may instead be denoted as transistor M1, M2, M3, etc. Similarly, first, second, third, etc., nodes, diodes, and resistors may also be introduced in the drawings and description as nodes N1, N2, N3, etc., diodes D1, D2, D3 etc. and resistors R1, R2 and so on.

Figure 3:
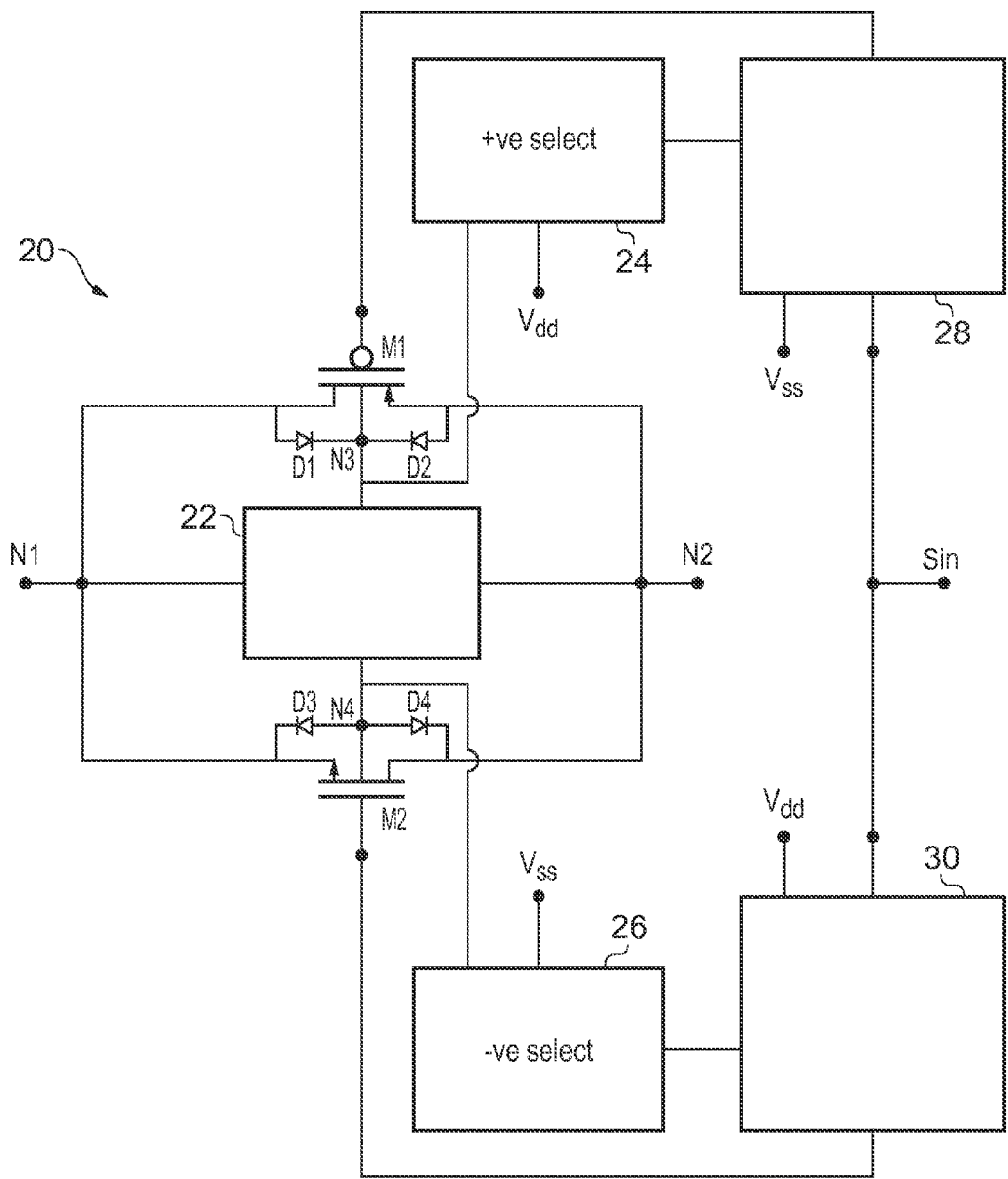
FIG. 3 is a schematic diagram of an analog switch in accordance with this disclosure.

FIG. 3 is a schematic diagram of an analog switch 20 constituting an embodiment of the disclosure. The switch 20 comprises first and second complimentary PMOS and NMOS transistors M1, M2, respectively, coupled in parallel. The drain of transistor M1 is coupled to the source of transistor M2 at a first node N1 and the source of transistor M1 is coupled to the drain of transistor M2 at a second node N2. The analog switch 20 is preferably fabricated on a single integrated circuit (IC), but may also be fabricated on more than one IC (and both dies may be provided in a single package) or using discrete components.

Nodes N1 and N2 correspond to the input and output of the switch 20. As with the transmission gate shown in FIGS. 1 and 2, because the switch is substantially symmetrical it is bidirectional, so either of N1 and N2 can be used as the input and conversely either of nodes N1 and N2 can be used as the output of the switch 20.

Like the transmission gate 1 shown in FIGS. 1 and 2, the gates of the first and second transistors M1 and M2 are driven in compliment, such that when the gate voltage at the first transistor M1 is at Logic 1, the gate voltage at the second transistor M2 is Logic 0, and vice versa. The difference between the highest gate voltage (Logic 1) and the lowest gate voltage (Logic 0) will be referred to herein as the "gate voltage range" of Gr.

Each of the field effect transistors M1, M2 has a back gate and this can be deliberately biased to ensure no current flow between the back gate and the semiconductor substrate in which the field effect transistor is fabricated. Additionally or alternatively, transistors may be fabricated in an insulated well such that they are isolated from the substrate. This technique is known in the art and need not be described further here.

The drain and back gate of the transistor M1 may be connected together by a diode D1 permitting current flow towards the back gate. Equally the source and back gate of the transistor M1 may be connected together by a diode D2 permitting current flow towards the back gate. The cathodes of D1 and D2 are connected to the back gate of M1. These diodes may be provided as separate components, or may be parasitic components as a result of parasitic bipolar transistors formed as part of fabricating the P-type FET M1.

Similarly, the drain and back gate of the transistor M2 may be connected together by a diode D3 permitting current flow towards the drain, and the source and back gate of the transistor M2 may be connected together by a diode D4 permitting current flow towards the source. The anodes of diodes D3 and D4 are connected to the back gate of M2.

These diodes may be parasitic components or may be provided as separate components.

Figure 4:
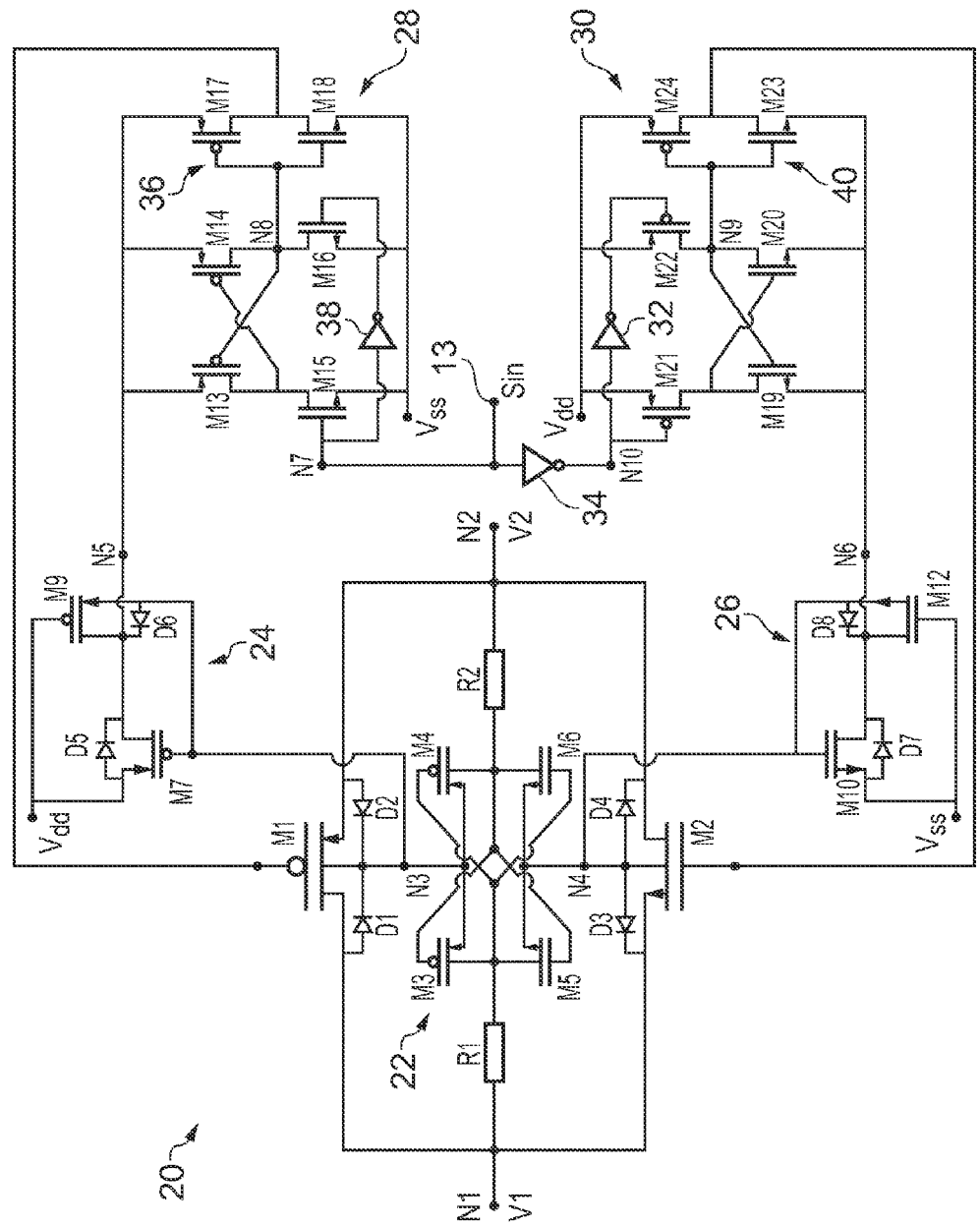
FIG. 4 is a circuit diagram of an analog switch in accordance with this disclosure.

The switch further comprises control circuitry which may include one or more of a switch bias circuit 22, most-positive and most-negative selection circuits 24, 26 and positive and negative level shifters 28, 30. FIG. 4 shows a schematic circuit diagram of the switch 20 shown in FIG. 3, illustrating the structure of the control circuitry in detail.

The control circuitry is configured to drive the voltage applied to the gates of the first and second transistors M1, M2 such that the switch functions correctly irrespective of the voltages herein referred to as first and second node voltages (V1 and V2), respectively applied to the first and second nodes N1 and N2.

The inventor has realized that to account for an overvoltage (where a voltage at one of the nodes N1, N2 rises above the most positive supply rail) and an undervoltage (where a voltage at one of the nodes N1, N2 falls below the most negative supply rail), the voltages $V_{G1}$, $V_{G2}$ applied to the gates of the first and second transistors M1, M2 may be controlled such that they can track instances of the first and second node voltages extending outside of the normal voltage range of the switch 20. For example, when the switch is to be placed in a conducting state, the gate of the PMOS transistor M1 may be supplied with $V_{ss}$ or with the most negative of the first node voltage, the second node voltage and $V_{ss}$. Similarly the gate of the NMOS transistor M2 may be supplied with $V_{dd}$ or the most positive of the first node voltage, the second node voltage and $V_{dd}$. Thus irrespective of the first and second node voltages, at least one of the transistors M1 and M2 always remains conducting. It is noted that in an overvoltage or an undervoltage conditions only one of the transistors M1, M2 may be conducting. For example, if the voltage at node N1 is less than $V_{ss}$ and the gate of M1 is tied to $V_{ss}$ then transistor M1 will only conduct if the voltage at node N2 is a threshold voltage (Vtp) higher than the voltage at N1. This may not be the case since in these conditions transistor M2 would be driven hard on and thus have a much lower resistance than M1, resulting in a relatively low voltage drop across M1. In contrast, if the voltage at node N1 is greater than $V_{dd}$ and the gate of transistor M2 is tied to $V_{dd}$ or to the most positive voltage (i.e. the voltage at node N1) then transistor M2 will not conduct unless the voltage at node N2 is a threshold voltage (Vtp) lower than the gate of M2 or Vtp lower than that at node N1. Again, this is unlikely to be the case since the resistance between the source and drain of transistor M1 would be much lower than that of M2 in these conditions. However, in either of the undervoltage and overvoltage conditions, at least one or transistors M1 and M2 will remain conducting.

When the switch 20 is to be placed in a non-conducting state, the gate of the PMOS transistor M1 is supplied with the most positive voltage selected from the first node voltage, the second node voltage and $V_{dd}$. The gate of the NMOS transistor M2 is supplied with the most negative of the first node voltage, the second node voltage and $V_{ss}$. Thus M1 and M2 are always biased (in this embodiment) to maintain them in a non-conducing state.

For example, to open the switch 20, i.e. inhibit current from passing between first and second nodes N1, N2, the control circuitry may be operable to drive the gate of the first transistor M1 with the most positive voltage of the first node voltage at the first node N1, the second node voltage at the second node N2 and the positive supply voltage $V_{dd}$. Accordingly, because the gate voltage range is dynamically controlled, the voltage at the first and second nodes N1 and N2 is prevented from extending outside of the gate voltage range and as such the gates of the first transistor M1 is always biased sufficiently to maintain correct operation of the switch, i.e. to prevent conduction when the switch is meant to be open (off). Similarly the second transistor is biased with the most negative voltage of the voltages at the first and second nodes and $V_{ss}$.

Referring to FIGS. 3 and 4, the switch bias circuit 22 is coupled between the first and second nodes N1, N2 of the switch 20 and is operable to provide the most positive of the first and second nodes voltages to an input of the most-positive selection circuit 24 via a positive output node N3, and further operable to provide the most negative of the first and second node voltages to an input of the most-negative selection circuit 26 via a negative output node N4.

As shown in FIG. 4, the switch bias circuit 22 comprises two PMOS transistors M3, M4 connected together by their respective sources at the positive output node N3, and two NMOS transistors M5, M6 connected together by their respective sources at the negative output node N4. The drain of PMOS transistor M3, the drain of NMOS transistor M5 and gates of transistors M4 and M6 are all connected to the first node N1 via a first optional resistor R1. Similarly, the drain of PMOS transistor M4, the drain of NMOS transistor M6 and gates of transistors M3 and M5 are all connected to the second node N2 via a second optional resistor R2.

The circuit operates by connecting the most positive of the first and second nodes N1 and N2 to node N3, and the most negative of the first and second nodes N1 and N2 to node N4. During operation if V1 at node N1 is greater than V2 at node N2 then we see from inspection of the circuit diagram that M6 tends to turn on and M4 tends to turn off. Similarly M5 tends to turn off and M3 tends to turn on. Thus the voltage from node N1 is supplied to node N3, and the voltage from node N2 is supplied to node N4. In contrast if the voltage at node N2 is greater than that at node N1 then the voltage at N2 gets supplied to N3 via M4 (M3 turning off), and the voltage at node N1 gets supplied to mode N4 via M5 (M6 turning off). In both cases, the most positive of the first and second node voltages is provided to the positive node N3, and the most negative of the first and second voltages is provided to the negative node N4.

Referring to both FIGS. 3 and 4, the positive node N3 is connected to the input of the most-positive selection circuit 24 and the negative node N4 is connected to the input of the most-negative selection circuit 26.

At the most-positive selection circuit 24, the most positive voltage of the first and second node voltages V1 and V2 received from the switch bias circuit 22 is compared with the positive supply voltage $V_{dd}$ and the most positive of those two voltages is output to the positive level shifter 28. Accordingly, the voltage provided to the positive level shifter 28 is the most positive of the voltage at the first node N1, the voltage at the second node N2 and the most positive supply voltage $V_{dd}$. As shown in FIG. 4, the most-positive selection circuit 24 comprises a PMOS transistor M7 having its source connected to the most positive supply voltage $V_{dd}$ and its drain connected to an output node N5 of the most-positive selection circuit 24. Additionally, the selection circuit 24 comprises a further PMOS transistor M9 having its drain connected to node N5 and its source, together with the gate of transistor M7, connected to the positive node N3 of the switch bias circuit 22. The gate of transistor M9 is coupled to the positive supply voltage $V_{dd}$. Transistors M7 and M9 further include diodes D5 and D6 connected between each of their sources (anode) and their drains (cathode). Diodes D5 and D6 may be inherent body diodes of the transistors M7, M9 or may be separate components. In operation, the most-positive selection circuit 24 compares the voltage received from the positive node N3 with $V_{dd}$ and provides the most positive of these voltages to node N5.

For example, if the voltage at node N3 is greater than $V_{dd}$, M7 is off since the gate voltage at transistor M7 is greater than the voltage applied to the source of M7. In contrast, the source voltage at transistor M9 exceeds the gate voltage $V_{dd}$ and so transistor M9 is switched on and a current flow path is formed between node N3 and node N5.

In the contrasting case, if the voltage at node N3 is less than $V_{dd}$, the source voltage at transistor M9 is less than the gate voltage $V_{dd}$ and so transistor M9 is switched off. Conversely, M7 is driven on since the gate voltage at transistor M7 is less than the voltage applied to its source and so a current flow path is formed through transistor M7 between $V_{dd}$ and node N5.

Thus, the most positive of $V_{dd}$ and the voltage at the positive node N3 is always be provided to node N5 of the most-positive selection circuit 24.

The most-negative selection circuit 26 operates in much the same manner as the most-positive selection circuit 24 but compares the received most negative output from the switch bias circuit 22 with the negative supply voltage $V_{ss}$ and the most negative of these two voltages is output to the negative level shifter 30.

The most-negative selection circuit 26 comprises an NMOS transistor M10 connected to the most negative supply voltage $V_{ss}$ by its source, the drain of M10 is connected to node N6. Additionally, the selection circuit 26 comprises a further NMOS transistor M12 having its drain connected to the negative selection circuit output node N6 and its source, together with the gate of transistor M10, connected to the negative node N4 of the switch bias circuit 22. The gate of transistor M12 is coupled to the negative supply voltage $V_{ss}$. As with transistors M7 and M9, diodes D7 and D8 are connected between source (anode) and drain (cathode) of each of transistors M10 and M12. These diodes D7 and D8 may be inherent body diodes or may be separate components.

During operation, if the voltage at node N4 is more negative than $V_{ss}$ (outside of the supply voltage range), transistor M10 is driven off since its gate voltage is more negative than the voltage applied to its source. At the same time, the voltage at the source of M12 is more negative than that applied to its gate, so transistor M12 is switched on and a current flow path is formed between node N4 and node N6.

In contrast, if the voltage at node N4 is less negative than $V_{ss}$ (i.e. the voltage at N4 is within the supply voltage range), M10 is driven on since the gate voltage at transistor M10 is more positive than the voltage applied to its source. In contrast transistor M12 is switched off since the voltage at the source of M12 is less negative than that applied to its gate. Accordingly, a current flow path is formed between $V_{ss}$ and node N6, via transistor M10.

Thus, the most-negative selection circuit 26 compares the voltage received from the node N4 with $V_{ss}$ and provides the most negative of these voltages to node N6.

The positive level shifter 28 and negative level shifter 30 are responsive to an control signal Sin to provide a buffered and level shifted representation of the control signal. When Sin=Logic 1, the level shifter 28 is operable to couple $V_{ss}$ to the gate of the first transistor M1 and to couple $V_{dd}$ to the gate of the second transistor M2. When Sin=Logic 0, the level shifter 28 is operable to couple the most positive voltage from node N5 to M1, and level shifter 30 provides the most negative voltage from node N6 to the gate of the second transistor M2. Thus the switch is non-conducting under this condition, and even if the voltages at the nodes N1 or N2 move outside the supply range, the gate voltages track outside of the power supply range defined by $V_{ss}$ and $V_{dd}$ as appropriate to ensure that the transmission gate 20 stays non conducting.

The positive level shifter 28 comprises a pair of PMOS transistors M13, M14 in series with respective NMOS transistors M15, M16, and cross connected to form an active load with positive feedback. The level shifter 28 also includes a first inverter 36 comprising a PMOS transistor M17 and an NMOS transistor M18. Sources of transistors M13 and M14 are connected to the positive node N5. The gate of transistor M13 is connected at node N8 to the drain of transistor M14, the drain of transistor M16 and the gates of transistors M17 and M18 of the first inverter 36. The gate of transistor M14 is connected to the drain of transistor M13 and the drain of transistor M15. The sources of transistors M15 and M16 are connected to the negative supply voltage $V_{ss}$. The gate of transistor M15 is connected to a control node N7. The gate of transistor M16 is connected to the control node N7 via an inverter 38. Transistor M17 is connected at its source to the positive node N5 and at its drain to the drain of transistor M18 and the gate of the first transistor M1 of the switch 20. The source of transistor M18 is connected to the most negative supply voltage $V_{ss}$.

The negative level shifter 30 is a mirror of the positive level shifter 28. The negative level shifter 30 comprises a pair of NMOS transistors M19, M20, a pair of PMOS transistors M21, M22 and a third inverter 40 comprising an NMOS transistor M23 and a PMOS transistor M24. Sources of transistors M19 and M20 are connected to the negative node N6. The gate of transistor M19 is connected at node N9 to the drain of transistor M22, the drain of transistor M20 and the gates of transistors M23 and M24 of the third inverter 40. The gate of transistor M20 is connected to the drain of transistor M21 and the drain of transistor M19. The sources of transistors M21 and M22 are connected to the positive supply voltage $V_{dd}$. The gate of transistor M21 is connected to the control node N10. The gate of transistor M22 is connected to the control node N10 via a fourth inverter 32. Transistor M23 is connected at its source to the negative node N6, its drain is connected to the drain of transistor M24 and the gate of the second transistor M2 of the switch 20. The source of transistor M24 is connected to the positive supply voltage $V_{dd}$.

Referring to the operation of the positive and negative level shifters 28 and 30 in more detail, when Sin=Logic 0 signaling to open (make non-conductive) the switch 20, node N7 is driven to Logic 0 ($V_{ss}$) and transistor M15 is switched off and transistor M16 is on (conducting). Accordingly, node N8 is connected to $V_{ss}$ and so transistor M13 is switched on and transistor M14 is switched off. A current flow path formed between $V_{ss}$ and N8 which causes transistor M17 to switch on and transistor M18 to switch off. As such, node N5 is connected via transistor M17 to the gate of the first transistor M1. At the same time, at the negative level shifter 30, a Logic 1 ($V_{dd}$) signal at node N10 causes transistor M21 to switch off and transistor M22 to switch on. Accordingly, node N9 is connected to $V_{dd}$ and so transistor M19 is switched on and as such the gate of transistor M20 is coupled to node N6 causing the transistor M20 to switch off. The current flow path formed between $V_{dd}$ and N9 causes transistor M23 to switch on and transistor M24 to be driven off. As such, node N6 is connected to the gate of the second transistor M2.

When Sin=Logic 1 signaling to close (make low impedance) the switch 20, node N7 is driven to Logic 1 ($V_{dd}$) and transistor M15 is turned on and transistor M16 is off. The gate of M14 is thus coupled to the negative supply voltage $V_{ss}$ and so M14 is switched on and as such M13 is switched off. The voltage at the second positive node N5 is thus provided to the gates of transistors M17 and M18 via transistor M14 causing transistor M17 to switch off and transistor M18 to switch on. This causes the negative supply voltage $V_{ss}$ to be connected to the gate of the first transistor M1. At the same time, the inverting action of the inverter 34 causes node N10 to be driven to Logic 0 ($V_{ss}$). Accordingly, transistor M21 is driven on and transistor M22 is driven off. This causes the gate of M20 to be coupled to $V_{dd}$ via transistor M21 and thus switch on and as such the gate of transistor M19 is driven low by the voltage at node N6 switching transistor M19 off. The voltage at the second negative node N6 is therefore provided at node N9 to the inputs of the inverter 40, causing $V_{dd}$ to be coupled to the gate of the second transistor M2 via transistor M24. Thus, when Sin=Logic 1, the gate of the first and second transistors M1 and M2 are driven by $V_{ss}$ and $V_{dd}$ respectively causing the switch to pass signals between the first and second nodes N1 and N2.

The embodiment shown in FIG. 4 allows bidirectional control of the switch 20 irrespective of the voltages at the first and second nodes N1 and N2. That is, a signal can be passed from the first node to the second node, or from the second node to the first node and the voltage at either or both of the first and second nodes can be outside of the supply voltage range, i.e. less than $V_{ss}$ or greater than $V_{dd}$. However, embodiments are not limited to bidirectional devices. In embodiments in which the switch is unidirectional, e.g. the voltage at the first node N1 is always greater than the voltage at the second node N2, the first node N1 may be coupled directly to the input of the most-positive selection circuit 24 and the second node N2 may be coupled directly to the input of the most-negative selection circuit 26.

Figure 5:
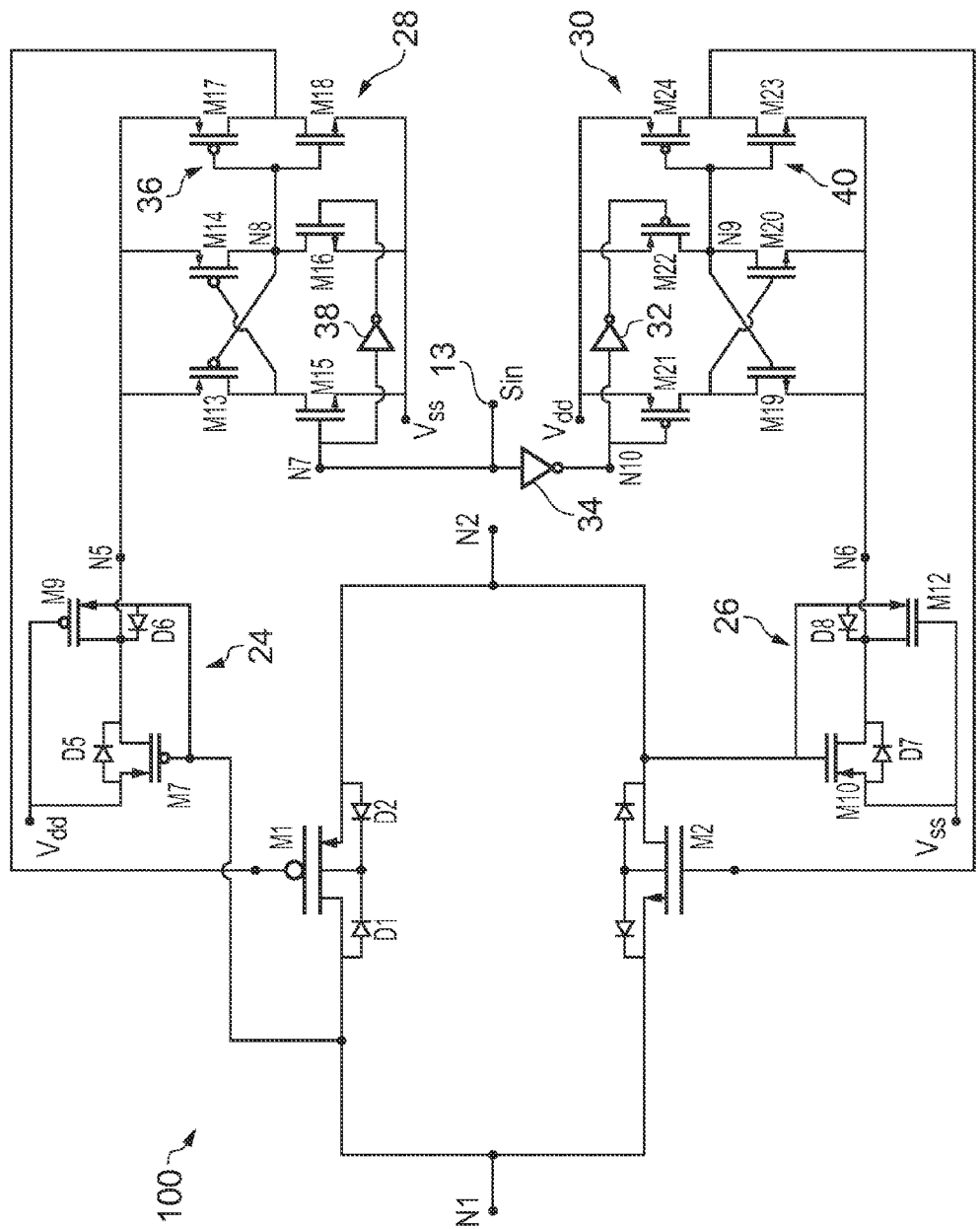
FIG. 5 is a circuit diagram of a variation of the analog switch shown in FIG. 4.

The analog switch 100 shown in FIG. 5 is a variation on the analog switch 20 of FIG. 4 where like reference numerals represent like parts. The analog switch 100 of FIG. 5 is a unidirectional device designed to pass/block signals passing from the first node N1 to the second node N2. Because of this, the voltage at the first node N1 should always equal or greater than the voltage at the second node N2 and so there is no need for a switch bias circuit to determine the most positive and most negative of the first and second node voltages. Accordingly, instead of having a switch bias circuit, the first voltage node N1 is coupled directly to the gates of transistor M7 and the source of transistor M9 of the most-positive selection circuit 24. Further, the second voltage node N2 is connected directly to the gates of transistor M10 and the drain of transistor M12 of the most-negative selection circuit 26.

As described previously, when the switch 20 of FIG. 4 is signaled to close, the level shifters 28, 30 operate to drive the gates of transistor M1 and M2 with $V_{ss}$ and $V_{dd}$.

Figure 6:
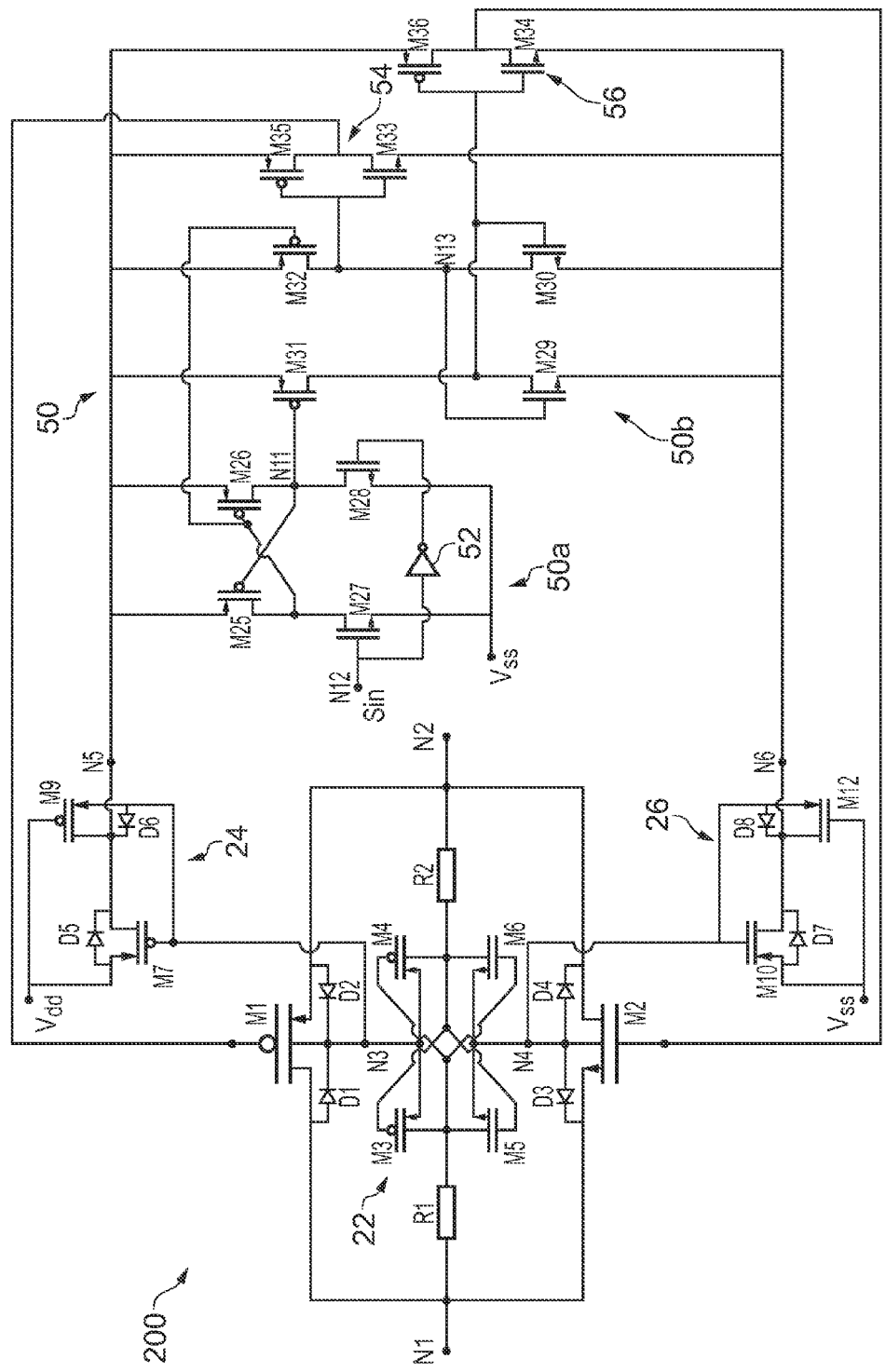
FIG. 6 is a circuit diagram of a further variation of the analog switch shown in FIG. 4.

The analog switch 200 shown in FIG. 6 is a variation on the analog switch 20 of FIG. 4 where like reference numerals represent like parts. In this variation, in contrast to the analog switch 20, when the transmission gate 200 is switched on, the gate of transistor M1 is driven with the most negative voltage of the voltage at node N1, the voltage at node N2 and $V_{ss}$ and the gate of transistor M2 is driven with the most positive voltage of the voltage at node N1, the voltage at node N2 and $V_{dd}$. To do so, the positive and negative level shifters 28, 30 of the analog switch 20 of FIG. 5 have been replaced by a single level shifter 50. This circuit enables tracking of overvoltage and undervoltage when the switch is in both its on state (i.e. low impedance or closed) and its off state (i.e. high impedance or open).

The level shifter 50 comprises first and second stages 50a, 50b. The first stage comprises a pair of PMOS transistors M25, M26 in series with respective NMOS transistors M27, M28, and cross connected to form an active load with positive feedback and an inverter 52. Sources of transistors M25 and M26 are connected to the positive node N5. The gate of transistor M25 is connected at node N11 to the drain of transistor M26 and the drain of transistor M28. The gate of transistor M26 is connected to the drain of transistor M25 and the drain of transistor M27. The sources of transistors M27 and M28 are connected to the negative supply voltage $V_{ss}$. The gate of transistor M27 is connected to a control node N12. The gate of transistor M28 is connected to the control node N12 via the inverter 52.

The second stage comprises a pair of NMOS transistors M29, M30, a pair of PMOS transistors M31, M32, and two inverters 54, 56 each comprising an NMOS transistor M33, M34 and a PMOS transistor M35, M36 respectively. Sources of transistors M29 and M30 are connected to the negative node N6. The gate of transistor M29 is connected at node N13 to the drain of transistor M32, the drain of transistor M30 and the gates of transistors M33 and M35 of the inverter 54. The gate of transistor M30 is connected to the drain of transistor M31, the drain of transistor M29 and the gates of transistors M34 and M36 of the inverter 56. The sources of transistors M31 and M32 are connected to the node N5. The gate of transistor M31 is connected to node N11 and the gate of transistor M32 is connected to gate of transistor M26 of the first stage 50a. Transistor M33 of the inverter 54 is connected at its source to the negative node N6 and its drain is connected to the drain of transistor M35 and the gate of transistor M1 of the switch 200. The source of transistor M35 is connected to the positive supply voltage node N5. Transistor M34 of the inverter 56 is connected at its source to the negative node N6 and its drain is connected to the drain of transistor M36 and the gate of transistor M2 of the switch 200. The source of transistor M36 is connected to the most positive node N5.

Referring to the operation of the level shifter 50, when Sin=Logic 0 signaling to open (make non-conductive) the switch 200, node N12 is driven to Logic 0 ($V_{ss}$) and transistor M27 is switched off and transistor M28 is on (conducting). Accordingly, node N11 is connected to $V_{ss}$ and so transistor M25 is switched on and transistor M26 is switched off. A current flow path is formed between $V_{ss}$ and N11 which causes transistor M31 to switch on whilst transistor M32 is connected via transistor M25 to node N5 and so is switched off. As such, transistor M29 is switched off and transistor M30 is switched on, coupling the input of the inverter 54 to the most negative node N6 and the input of the inverter 56 to the most positive node N5. Transistor M1 of the switch 200 is thereby driven by the most positive voltage of the voltage at node N1, the voltage at node N2 and $V_{dd}$. Transistor M2 of the switch 200 is driven by the most negative voltage of the voltage at node N1, the voltage at node N2 and $V_{ss}$. As such, M1 and M2 are held in a non-conducting state.

When Sin=Logic 1 signaling to close (make low impedance) the switch 20, node N12 is driven to Logic 1 ($V_{dd}$) and transistor M27 is turned on and transistor M28 is off. The gate of M26 is thus coupled to the negative supply voltage $V_{ss}$ and so M26 is switched on and as such M25 is switched off. A current flow path is formed between nodes N5 and N11 which causes transistor M31 to switch off whilst the gate of transistor M32 is connected via transistor M27 to $V_{ss}$ and so is switched on. As such, transistor M29 is switched on and transistor M30 is switched off, coupling the input of the inverter 54 to the most positive node N5 and the input of the inverter 56 to the most negative node N6. Transistor M1 of the switch 200 is thereby driven by the most negative voltage of the voltage at node N1, the voltage at node N2 and $V_{ss}$. Transistor M2 of the switch 200 is driven by the most positive voltage of the voltage at node N1, the voltage at node N2 and $V_{dd}$. As such, M1 and M2 are held in a conducting state.

It will be appreciated that analog switches described above may be implemented using discrete components or implemented on one or more integrated circuits. It will also be appreciated that one or more analog switches may be fabricated on the same or multiple integrated circuits.

The terms "drain" and "source" have been used herein as these are commonplace terms used to describe field effect transistors. However for substantially symmetrical devices these terms are interchangeable, and the drain and source can be regarded as interchangeable connections at opposing ends of a controllable channel within the transistor.

The claims presented herewith are drafted in single dependency format suitable for use at the US patent office. However it is to be understood that any claim may depend on any preceding claim of the same type unless that is clearly not technically feasible.

The invention claimed is:

1. An analog switch that adjusts voltages on its switching transistors to meet a desired switching state, comprising:
    a P-type first transistor having a source, a drain and a gate;
    an N-type second transistor having a source, a drain and a gate where the source of the second transistor is directly coupled to the drain of the first transistor at a first node and the drain of the second transistor is directly coupled to the source of the first transistor at a second node;
    a switch control circuit configured to:
        drive the gates of the first and second transistors, wherein the driving permits or inhibits signal transmission through the analog switch depending on a control signal,
        wherein if the control signal indicates that signal transmission is permitted and a voltage of an input signal at the first or second node falls outside of a supply rail voltage range of the switch control circuit, the driving applies a voltage corresponding to the voltage of the input signal, thereby permitting the input signal to pass between the first and second nodes, and
        wherein when the voltage at the first or second node falls outside of the supply rail voltage range of the switch control circuit and signal transmission is inhibited, the switch control circuit drives the gate of the first transistor with a voltage corresponding to the most positive voltage of the voltage at the first node and the voltage at the second node and drives the gate of the second transistor with a voltage corresponding to the most negative voltage of the voltage at the first node and the voltage at the second node.

2. The analog switch as claimed in claim 1, wherein the first and second transistors are switching transistors.

3. The analog switch as claimed in claim 1, wherein the switch control circuit is configured to:
    identify, through voltage comparisons, the most positive voltage among the voltage at the first node, the voltage at the second node, and a positive supply rail voltage of the switch control circuit;
    identify, through voltage comparisons, the most negative voltage among the voltage at the first node, the voltage at the second node, and a negative supply rail voltage of the switch control circuit;
    supply the gate of the first transistor with the identified most positive voltage if the control signal indicates that signal transmission is inhibited; and
    supply the gate of the second transistor with the identified most negative voltage if the control signal indicates that signal transmission is inhibited.

4. The analog switch as claimed in claim 1, in which the first transistor has a back gate and the second transistor has a back gate, and the switch control circuit is further operable to:
    compare the voltage at the first node to the voltage at the second node to identify the more positive and the more negative of the voltages at the first node and the second node;
    supply the identified more positive voltage to the back gate of the first transistor;
    supply the identified more negative voltage to the back gate of the second transistor.

5. The analog switch as claimed in claim 4, further comprising third to sixth field effect transistors, where the third and fourth transistors are P-type PETs and the fifth and sixth transistors are N-type PETs; and
    a drain of the third transistor is coupled to the first node, a source of the third transistor is coupled to the back gate of the first transistor, and a gate of the third transistor is coupled to the second node;
    a drain of the fourth transistor is coupled to the second node, a source of the fourth transistor is coupled to the back gate of the first transistor, and a gate of the fourth transistor is coupled to the first node;
    a drain of the fifth transistor is coupled to the first node, a source of the fifth transistor is coupled to the back gate of the second transistor, and a gate of the fifth transistor is coupled to the second node; and
    a drain of the sixth transistor is coupled to the second node, a source of the sixth transistor is coupled to the back gate of the second transistor and a gate of the sixth transistor is coupled to the first node.

6. The analog switch as claimed in claim 1, further comprising a most positive selection circuit configured to:
    compare a voltage corresponding to the more positive of the voltages at the first node and the second node to a positive supply rail voltage to identify the most positive voltage among the voltage at the first node, the voltage at the second node, and the positive supply rail voltage; and
    output the identified most positive voltage at a positive selection circuit output node.

7. The analog switch as claimed in claim 6, further comprising a circuit arranged to receive the output from the positive selection circuit, a negative supply rail voltage, and the control signal, and to supply the gate of the first transistor with either the output of the positive selection circuit or the negative supply rail voltage depending on a state of the control signal.

8. The analog switch as claimed in claim 1, further comprising a most negative selection circuit configured to:
    compare a voltage corresponding to the more negative of the voltages at the first node and the second node to a negative supply rail voltage to identify the most negative voltage among the voltage at the first node, the voltage at the second node, and the negative supply rail voltage; and output the identified most negative voltage at a negative selection circuit output node.

9. The analog switch as claimed in claim 8, further comprising a circuit arranged to receive the output from the most negative selection circuit, a positive supply rail voltage and the control signal, and to supply the gate of the second transistor with either the output of the most negative selection circuit or the positive supply rail voltage depending on a state of the control signal.

10. The analog switch as claimed in claim 1, in which the first and second transistors and the switch control circuit are provided inside an integrated circuit package.

11. The analog switch as claimed in claim 1, in which the first and second transistors and the switch control circuit are formed on a shared semiconductor substrate.

12. The analog switch as claimed in claim 1, wherein if the control signal indicates that signal transmission is permitted, the switch control circuit supplies the most positive of the voltage at the first node, the voltage at the second node and a positive supply rail voltage to the gate of the second transistor and supplies the most negative of the voltage at the first node, the voltage at the second node and a negative supply rail voltage to the gate of the first transistor.

13. A method of driving an analog switch to permit passing of voltages that are outside of a supply rail voltage range of the switch, comprising:

tracking voltages at a first node and a second node of the switch, wherein the switch includes a P-type first transistor and an N-type second transistor, wherein a source of the second transistor is directly coupled to a drain of the first transistor at the first node and a drain of the second transistor is directly coupled to a source of the first transistor at the second node, and wherein when an input voltage outside of the supply rail voltage range is present at one of the first node and the second node, the tracking generates a voltage corresponding to the input voltage; and driving the first transistor and the second transistor, wherein if a control signal indicates that signal transmission is permitted, the driving applies the voltage generated by the tracking to the first transistor or the second transistor, thereby permitting the switch to pass the input voltage that is outside of the supply rail voltage range, and wherein when the voltage at the first or second node falls outside of the supply rail voltage range of the switch control circuit and signal transmission is inhibited, the switch control circuit drives a gate of the first transistor with a voltage corresponding to the most positive voltage of the voltage at the first node and the voltage at the second node and drives a gate of the second transistor with a voltage corresponding to the most negative voltage of the voltage at the first node and the voltage at the second node.

14. The method as claimed in claim 13, further comprising:

comparing the voltage at the first node to the voltage at the second node to select the more positive and the more negative of the voltage at the first node and the voltage at the second node for output as intermediate voltages.

15. The method as claimed in claim 14, further comprising:

comparing the more positive intermediate voltage to a positive supply rail voltage; and driving the gate of the first transistor with the more positive intermediate voltage when the more positive intermediate voltage exceeds the positive supply rail voltage and the control signal indicates that signal transmission is inhibited.

16. The method as claimed in claim 14, further comprising:

comparing the more negative intermediate voltage to a negative supply rail voltage; and driving the gate of the second transistor with the more negative intermediate voltage when the more negative intermediate voltage exceeds the negative supply rail voltage and the control signal indicates that signal transmission is inhibited.

17. The method as claimed in claim 14, further comprising:

biasing a back gate of the first transistor with the more positive intermediate voltage; and biasing a back gate of the second transistor with the more negative intermediate voltage.

18. The method as claimed in claim 13, further comprising:

detecting when the input voltage is outside of the supply rail voltage range by (i) identifying the most positive voltage among the voltage at the first node, the voltage at the second node, and a positive supply rail voltage and (ii) identifying the most negative voltage among the voltage at the first node, the voltage at the second node, and a negative supply rail voltage.

19. An analog switch configured to pass voltages that are outside of a supply rail voltage range of the switch, comprising:

a P-type first transistor and an N-type second transistor, wherein a source of the second transistor is directly coupled to a drain of the first transistor at a first node and a drain of the second transistor is directly coupled to a source of the first transistor at a second node;

means for tracking voltages at the first node and the second node, wherein when an input voltage outside of the supply rail voltage range is present at one of the first node and the second node, the tracking means generates a voltage corresponding to the input voltage; and means for driving the first transistor or the second transistor based on the voltage generated by the tracking means if a control signal permits signal transmission, thereby permitting the switch to pass the input voltage that is outside of the supply rail voltage range, wherein when the voltage at the first or second node falls outside of the supply rail voltage range of the switch control circuit and signal transmission is inhibited, the switch control circuit drives a gate of the first transistor with a voltage corresponding to the most positive voltage of the voltage at the first node and the voltage at the second node and drives a gate of the second transistor with a voltage corresponding to the most negative voltage of the voltage at the first node and the voltage at the second node.

20. The analog switch as claimed in claim 19, further comprising:

a detection arrangement to detect when the input voltage is outside of the supply rail voltage range, the detection arrangement including:

means for identifying the most positive voltage among the voltage at the first node, the voltage at the second node, and a positive supply rail voltage; and means for identifying the most negative voltage among the voltage at the first node, the voltage at the second node, and a negative supply rail voltage.

* * * * *